(12) United States Patent
Song

(10) Patent No.: US 10,367,171 B2
(45) Date of Patent: Jul. 30, 2019

(54) LOW REFLECTIVE DISPLAY DEVICE

(71) Applicant: RESEARCH & BUSINESS FOUNDATION SUNGKYUNKWAN UNIVERSITY, Suwon-si, Gyeonggi-do (KR)

(72) Inventor: Jang Kun Song, Gwacheon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/855,982

(22) Filed: Dec. 27, 2017

(65) Prior Publication Data

US 2018/0190942 A1  Jul. 5, 2018

(30) Foreign Application Priority Data

Dec. 29, 2016  (KR) .................. 10-2016-0182811
Dec. 13, 2017  (KR) .................. 10-2017-0171433

(51) Int. Cl.
*H01L 51/52* (2006.01)
*G02B 3/00* (2006.01)
(Continued)

(52) U.S. Cl.
CPC ........ *H01L 51/5275* (2013.01); *G02B 3/0056* (2013.01); *G02B 17/002* (2013.01);
(Continued)

(58) Field of Classification Search
CPC ...... H01L 51/50–51/56; H01L 27/3218; H01L 27/3244; H01L 27/3216; G02B 17/002; G06F 3/041
See application file for complete search history.

(56) References Cited

U.S. PATENT DOCUMENTS

2003/0011303 A1* 1/2003 Matthies ............. G02F 1/13336
                                                        313/506
2004/0135499 A1* 7/2004 Cok ..................... H01L 51/5281
                                                        313/506
(Continued)

FOREIGN PATENT DOCUMENTS

JP  2003317931 A  11/2003
JP  2015087707 A   5/2015
KR  20040036664 A  4/2004

*Primary Examiner* — Thao X Le
*Assistant Examiner* — Gardner W. S. Swan
(74) *Attorney, Agent, or Firm* — NSIP Law

(57) ABSTRACT

The low reflective display device a low reflective unit including a plurality of optical lens structures arranged in a position-corresponding manner to the plurality of sub-pixels thereon respectively; a light-reflective layer covering the side-wall face of each optical lens structure; and a light-absorbing member arranged to fill spaces between neighboring optical lens structures, wherein the bottom face of each of the plurality of optical lens structures completely covers the top face of the corresponding sub-pixel among the plurality of sub-pixels, wherein the bottom face of each of the plurality of optical lens structures receives all of light-beams generated from the corresponding sub-pixel, and wherein the bottom face of each of the plurality of optical lens structures has an area that is greater than or equal to a top face area of the corresponding sub-pixel.

15 Claims, 15 Drawing Sheets

(51) Int. Cl.
    *G02B 17/00*   (2006.01)
    *H01L 51/56*   (2006.01)
    *H01L 27/32*   (2006.01)
    *G06F 3/041*   (2006.01)

(52) U.S. Cl.
    CPC .......... *H01L 51/5271* (2013.01); *H01L 51/56* (2013.01); *G06F 3/041* (2013.01); *H01L 27/3218* (2013.01); *H01L 27/3244* (2013.01); *H01L 51/5284* (2013.01)

(56) References Cited

U.S. PATENT DOCUMENTS

| | | | | |
|---|---|---|---|---|
| 2006/0238545 | A1* | 10/2006 | Bakin | G02B 27/2214 345/613 |
| 2009/0261371 | A1* | 10/2009 | Schindler | H01L 51/5203 257/98 |
| 2014/0367633 | A1* | 12/2014 | Bibl | G02F 1/133603 257/13 |
| 2015/0204510 | A1* | 7/2015 | Park, II | F21V 5/04 362/332 |
| 2016/0064694 | A1* | 3/2016 | Choi | H01L 51/5275 257/40 |
| 2016/0351116 | A1* | 12/2016 | Sun | H01L 27/3218 |
| 2016/0380238 | A1* | 12/2016 | Ma | H01L 51/5275 257/40 |
| 2018/0198045 | A1* | 7/2018 | Perzlmaier | H01L 33/38 |

* cited by examiner

[FIG. 1]
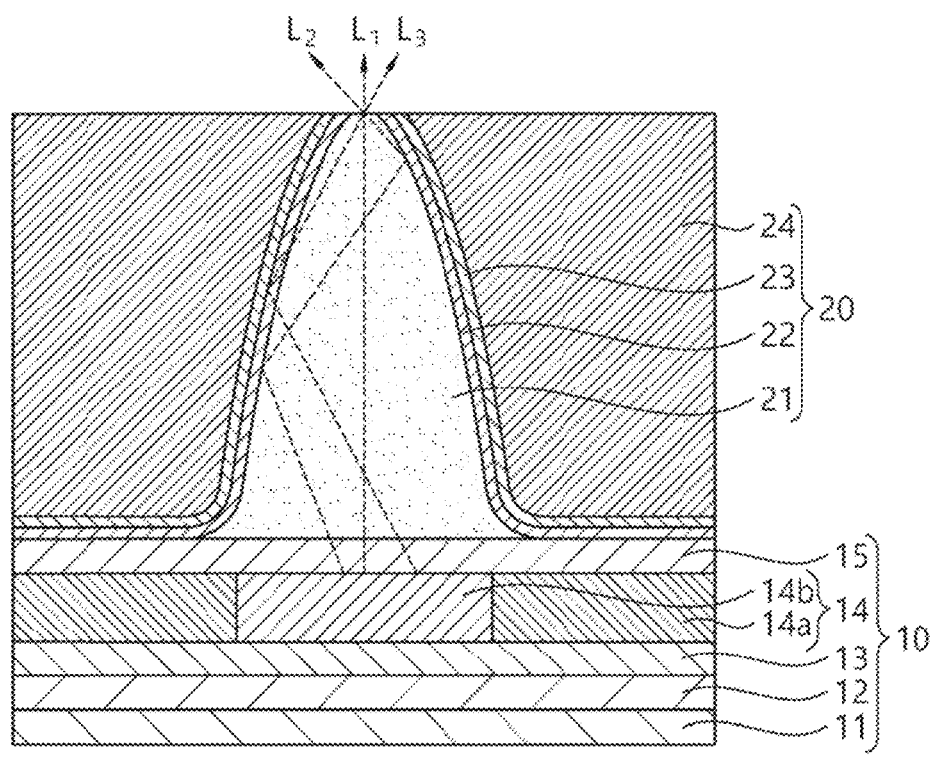

[FIG. 2]
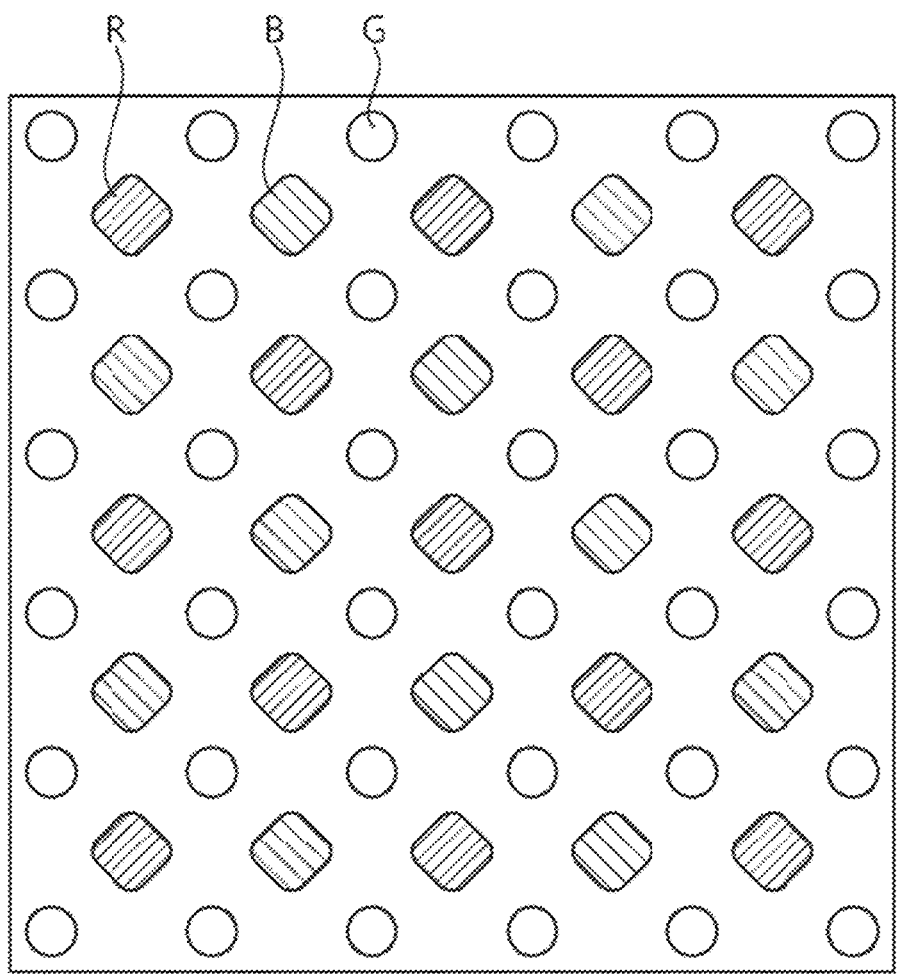

[FIG. 3]
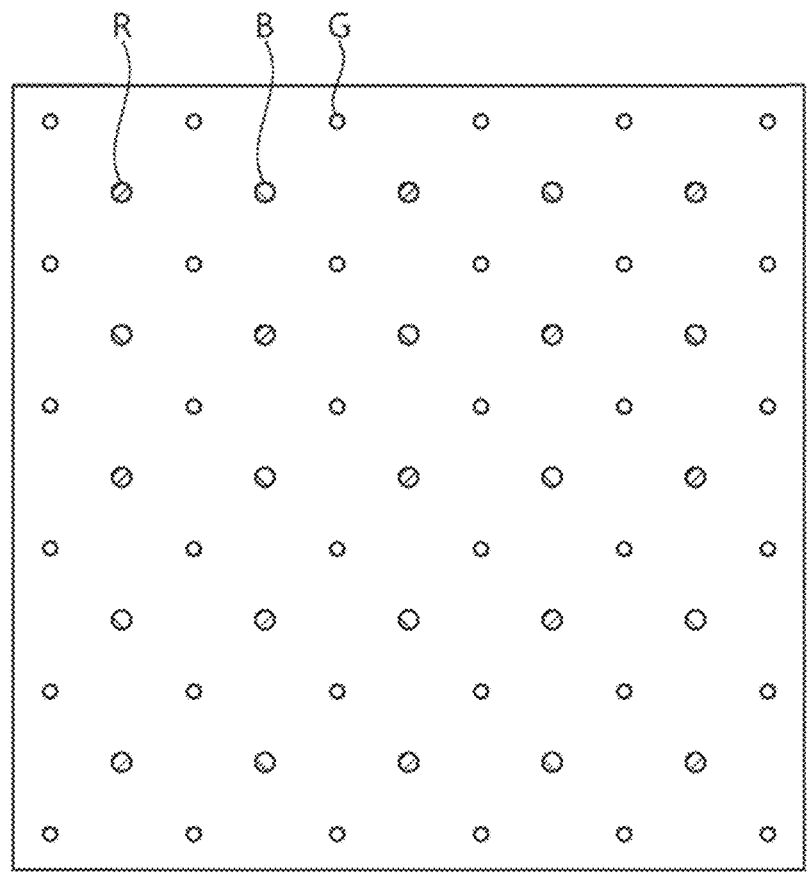

[FIG. 4]
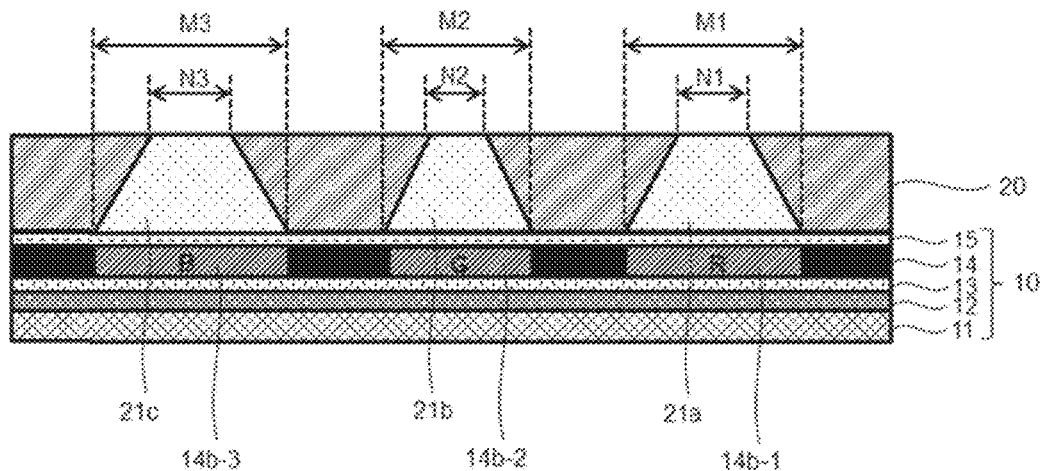
[FIG. 5A]
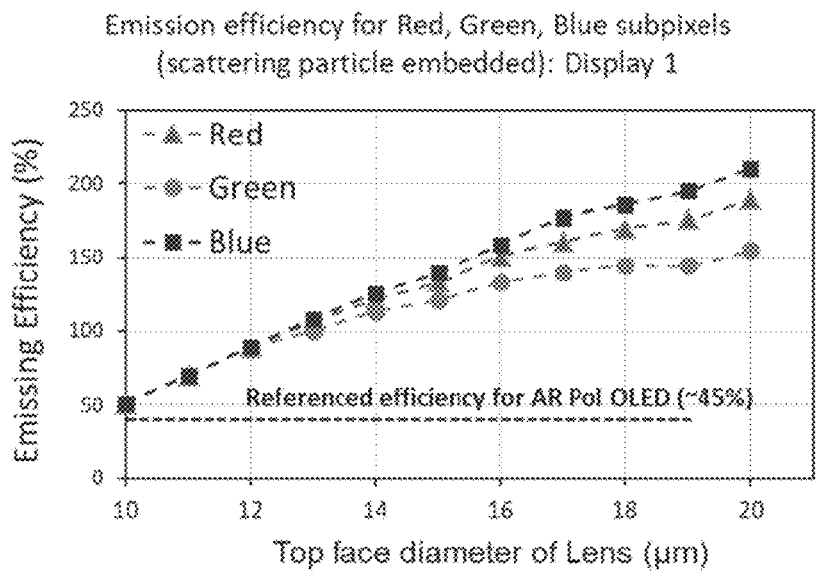

[FIG. 5B]
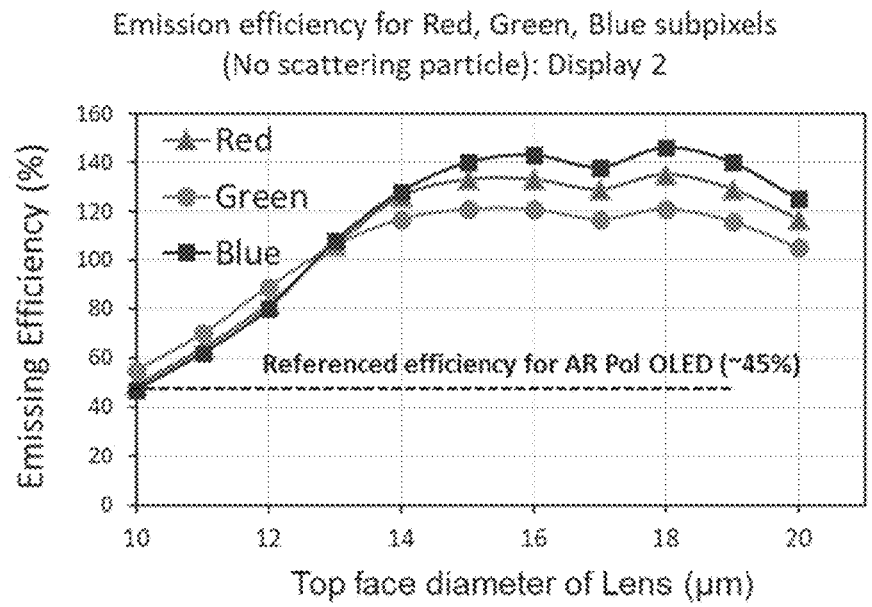
[FIG. 6]
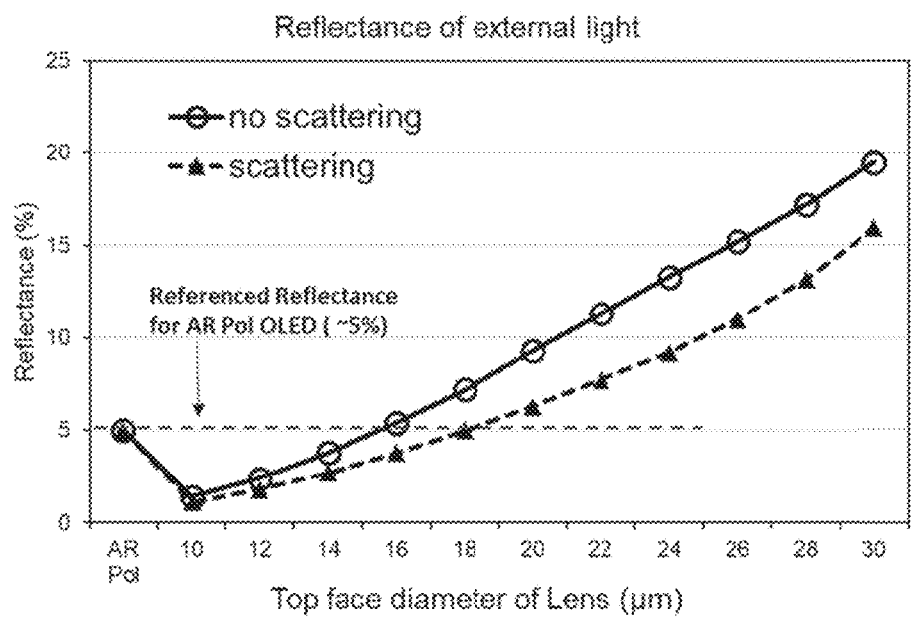

[FIG. 7]
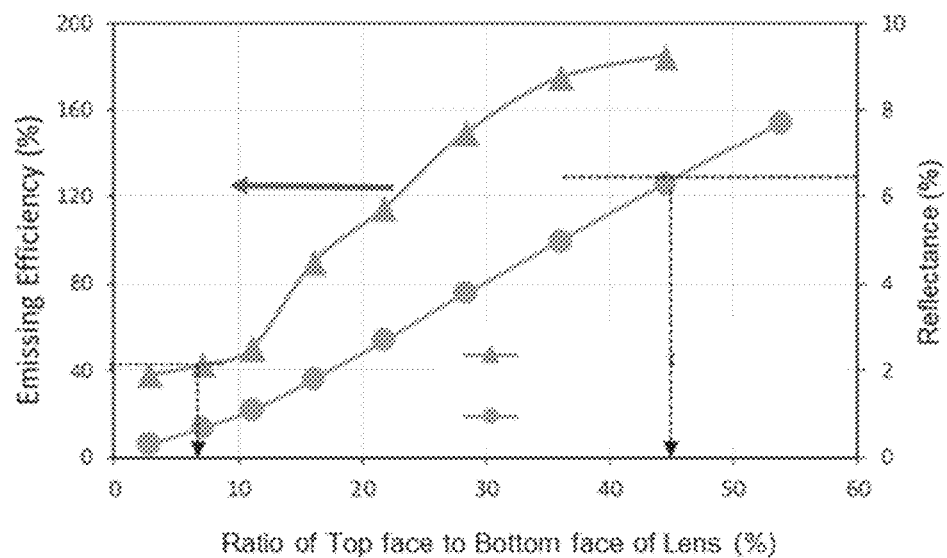
[FIG. 8A]
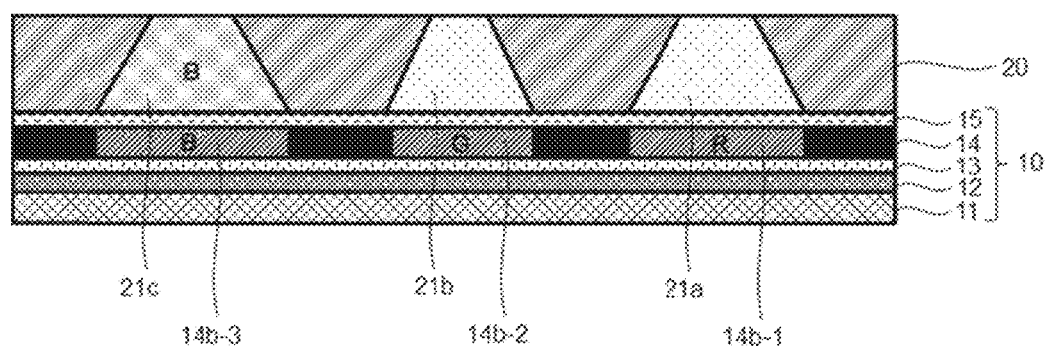

[FIG. 8B]
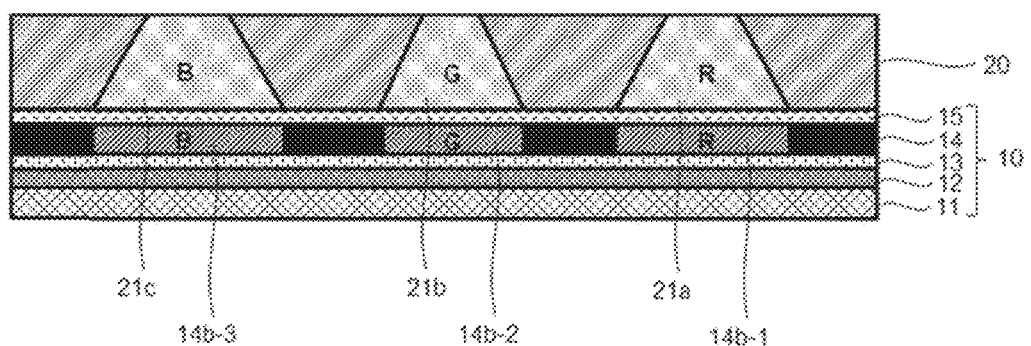
[FIG. 9]
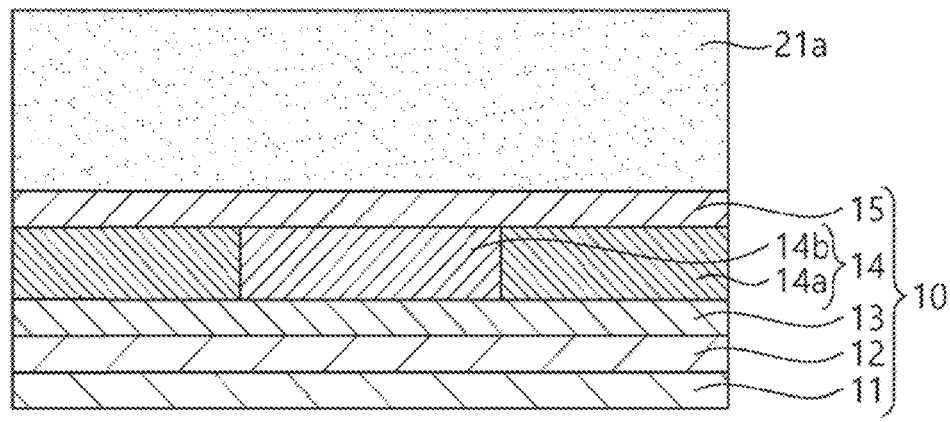

[FIG. 10]
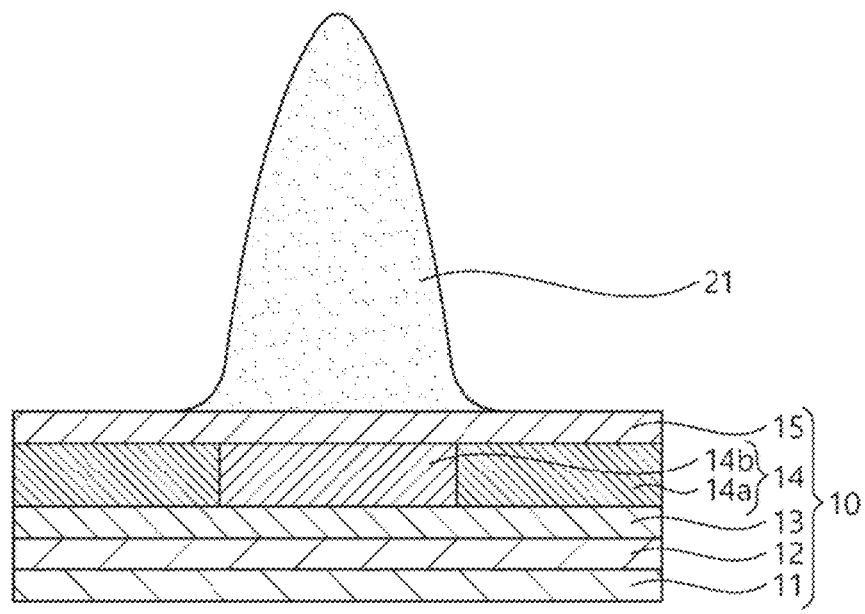
[FIG. 11]
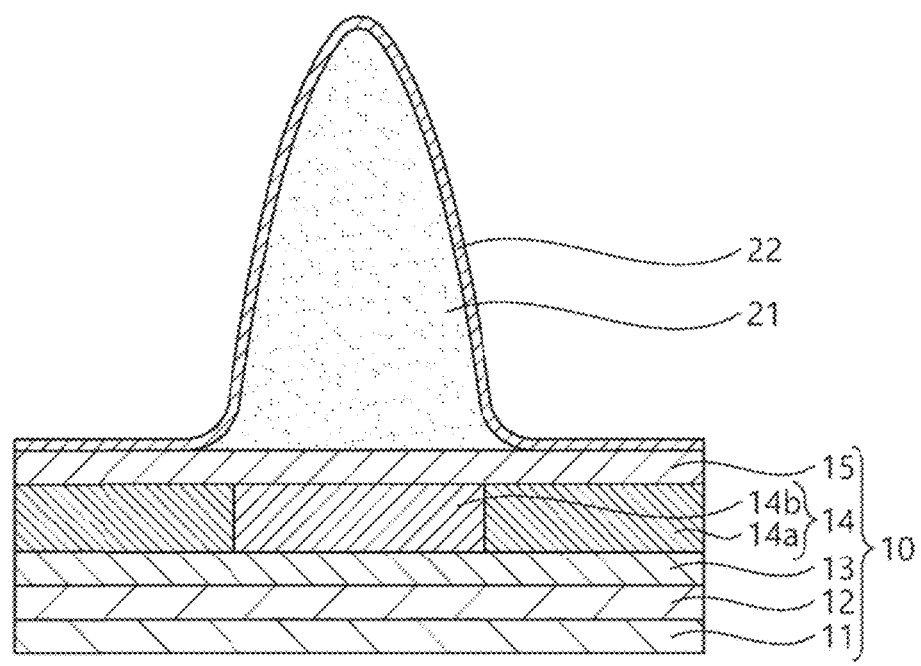

[FIG. 12]
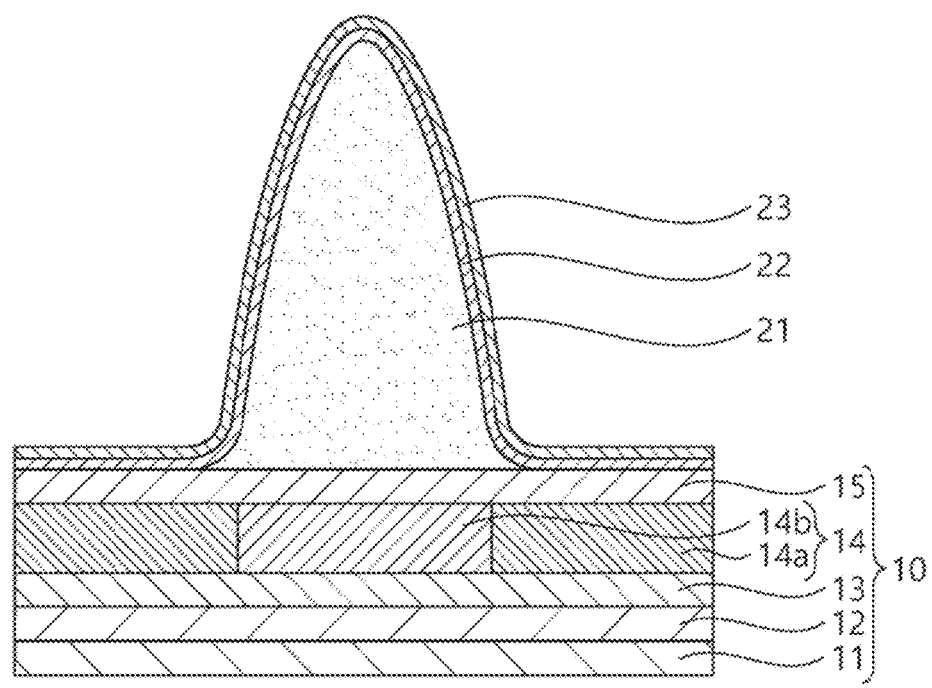

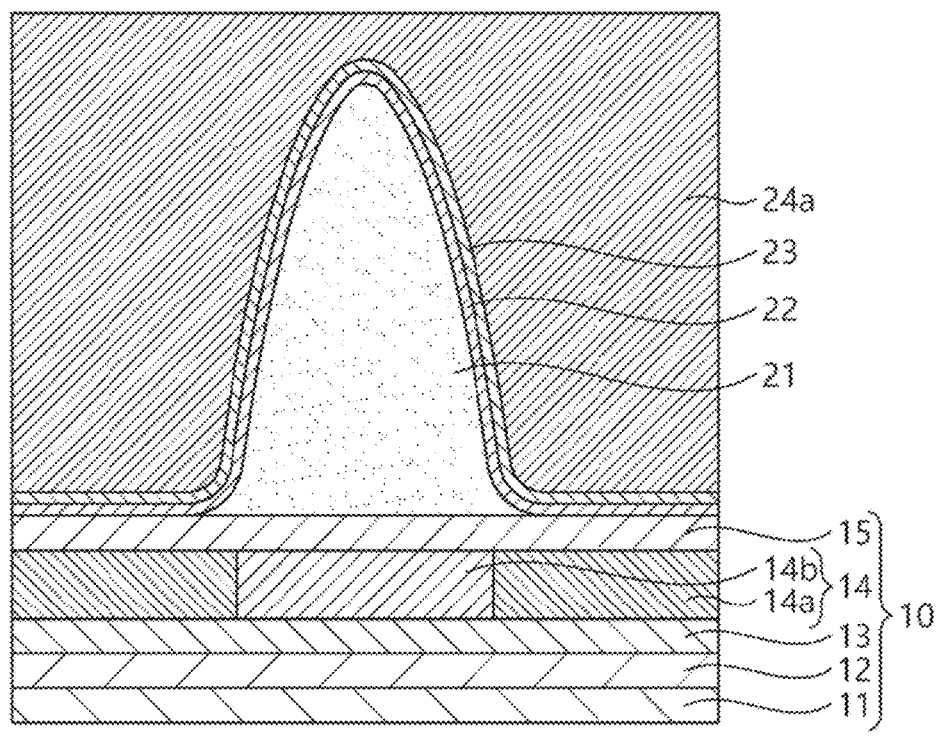
[FIG. 13]

[FIG. 14]
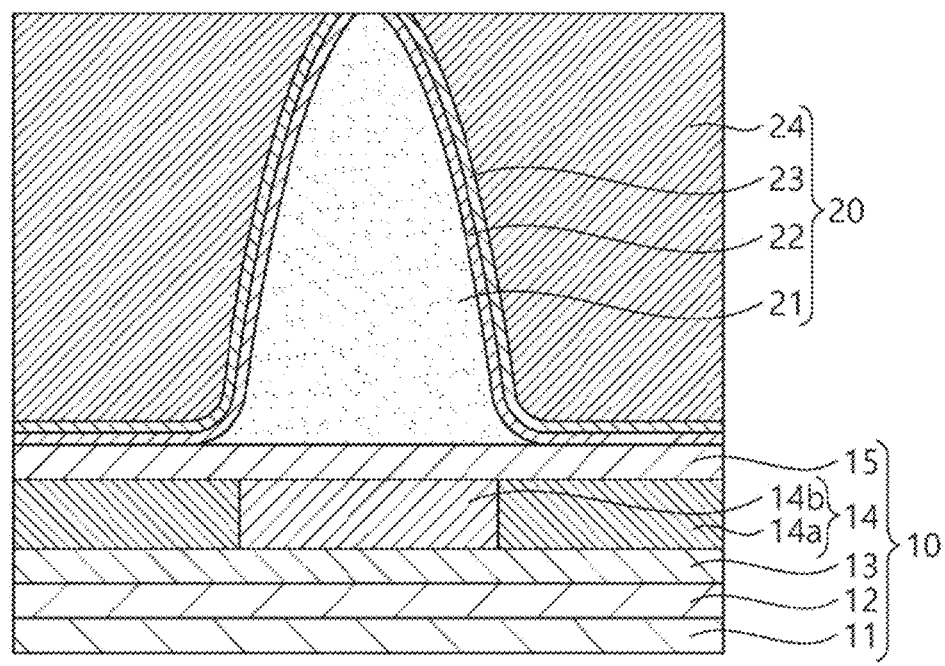

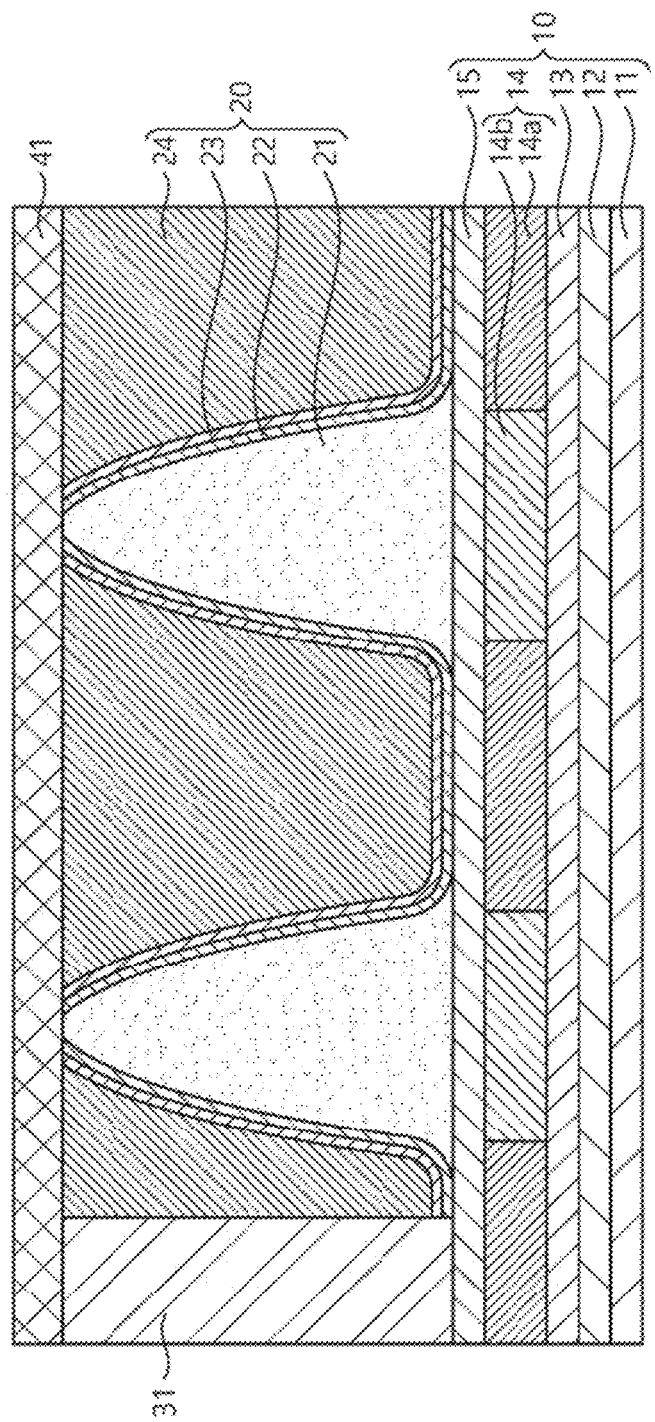

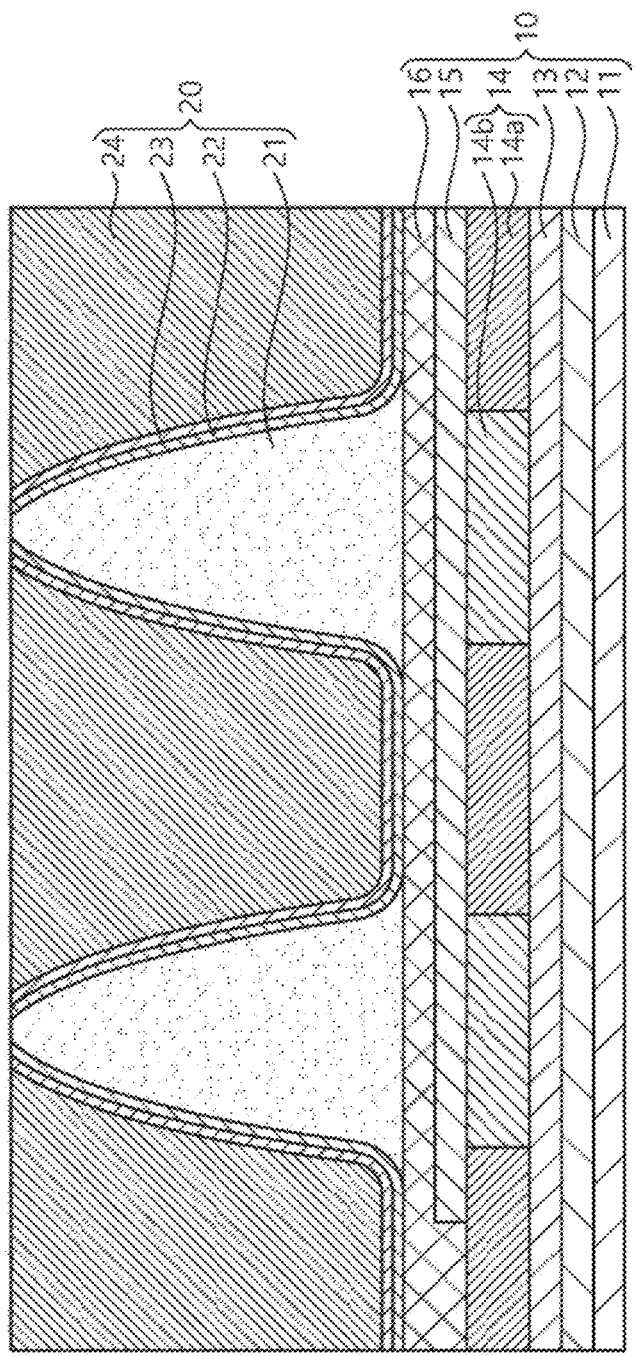
[FIG. 16]

[FIG. 17]
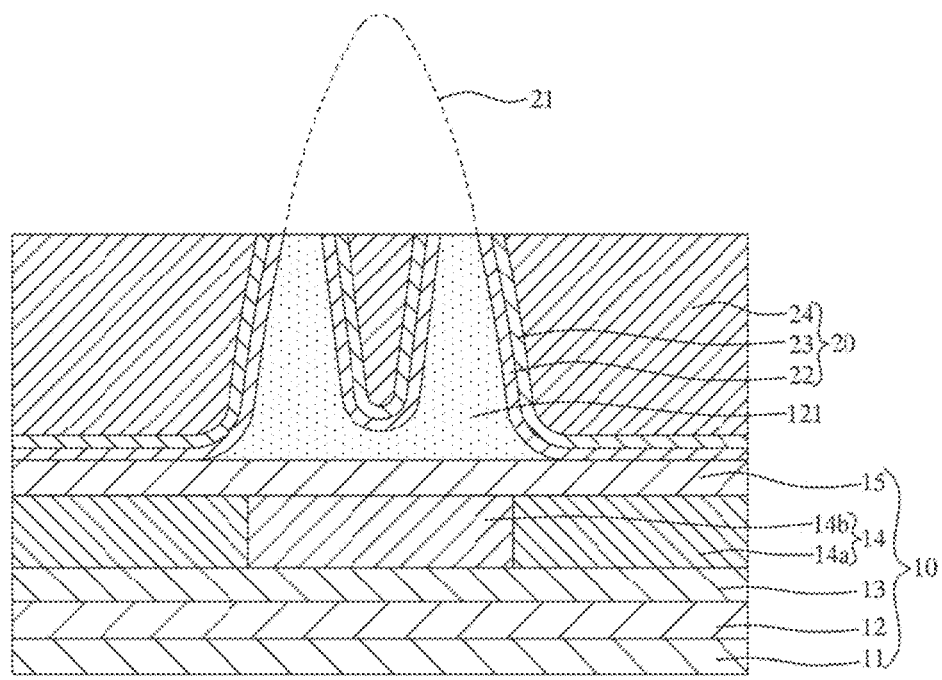

[FIG. 18]
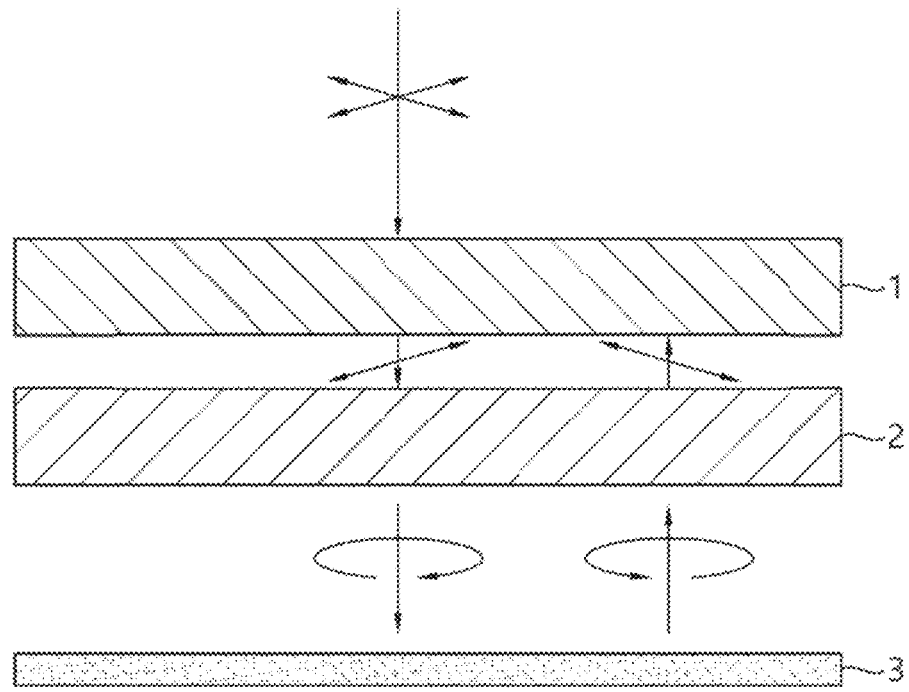

LOW REFLECTIVE DISPLAY DEVICE

CROSS-REFERENCE TO RELATED APPLICATION

This application claims the priority benefit from Korean Patent Application No. 10-2016-0182811 filed Dec. 29, 2016 and Korean Patent Application No. 10-2017-0171433 filed Dec. 13, 2017, the entire contents of each of which are incorporated herein by reference.

BACKGROUND OF THE INVENTION

Field of the Present Disclosure

The present disclosure relates to a low reflective display device, and more particularly, to a low reflective display device that reduces the reflectance of externally-incident light beams.

Discussion of Related Art

OLED (organic light emitting display device) typically has an anti-reflection polarizer (AR Pol) film with a low-reflective function as attached to a front side of a display panel to suppress reflection of the external light-beams.

FIG. 18 is a view for illustrating a structure of a display device including a conventional low-reflective AR Pol film.

As shown in FIG. 18, the conventional AR Pol includes a dichroic linear polarizer plate 1 and a quartwave plate (QWD) 2, which are arranged such that their optical axes cross each other at 45 degrees.

When non-polarized light enters the plate 1 and 2 in AR Pol, the incident light passes through the dichroic linear polarizer plate 1 and becomes linearly polarized light in a certain direction. The linearly polarized light passes through the underlying QWD 2 and becomes a left-circularly polarized light (or a right-circularly polarized light). After the circularly polarized light being reflected by the reflective layer 3 inside the display panel, the handedness of the circular polarized light is reversed to become the right circularly polarized light (or left circularly polarized light).

Then, the light reflected from the reflective layer 3 passes through the QWD 2 again and becomes linearly polarized light. In this connection, since the handedness of the circularly polarized light is changed by reflecting from the reflection layer 3, the direction of the polarization after passing through the QWD 2 becomes a direction orthogonal to the direction of linear polarization at the time of incidence. Thus, the linearly polarized light with the polarization direction rotated by 90 degrees passes through the dichroic linear polarizer plate 1 again and is absorbed thereby. As a result, the light is not emitted to the outside. As a result, since the external light is not reflected, only the light generated inside the display panel is observed by the viewer, so that the viewer can see clear image quality.

However, since the internal light generated inside the display device is composed of the right-circularly polarized component and the left-circularly polarized component, the internal light in the display device also passes through the low-reflective AR polarizer plates 1 and 2, where either the right or left circularly polarization components cannot pass through the low-reflective polarizer plate 1 and 2. Therefore, even in the case of ideal low-reflective polarizer plate 1 and 2, only up to 50% of the internal light of the display device including this plate is emitted to the outside.

Therefore, in the case of the current display device including the AR Pol, the reflectance of the external light-beam incident from the outside may be lowered, but the emission efficiency of the internal light is lowered as well.

SUMMARY OF THE INVENTION

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure provides a low reflective and high efficient display device that improves light-beam exit efficiency of a display device while lowering the reflectance of external light incident from the outside.

The purposes of the present disclosure are not limited to those mentioned above. Other purposes not mentioned may be clearly understood to those skilled in the art from the following descriptions.

In one aspect of the present disclosure, there is provided a low reflective and high efficient display device comprising: a light-emitting unit comprising a plurality of sub-pixels separated from each other by spacers; and a low reflective unit disposed on the light-emitting unit, wherein the low reflective unit comprises: a plurality of optical lens structures arranged in a position-corresponding manner to the plurality of sub-pixels thereon respectively, wherein each of the plurality of optical lens structures has a bottom face onto which light-beams generated from the sub-pixels are incident, a top face out of which the incident light beams are emitted, and a side-wall face connecting the bottom face and the top face of the optical lens structure; a light-reflective layer covering the side-wall face of each optical lens structure, wherein the light-reflective layer reflects light-beams incident on the side-wall face from the corresponding sub-pixel into the optical lens structure; and a light-absorbing member arranged to fill spaces between neighboring optical lens structures, wherein the light-absorbing member is configured to expose the bottom and top faces of each of the plurality of optical lens structures, wherein the bottom face of each of the plurality of optical lens structures completely covers the top face of the corresponding sub-pixel among the plurality of sub-pixels, wherein the bottom face of each of the plurality of optical lens structures receives all of light-beams generated from the corresponding sub-pixel, and wherein the bottom face of each of the plurality of optical lens structures has an area that is greater than or equal to the light-emission area of the corresponding sub-pixel.

In one embodiment, the light-reflective layer has a lower refractive index than the optical lens structure such that the light-reflective layer totally reflects a light-beam incident on the side-wall face of the corresponding optical lens structure among the light-beams generated from the corresponding sub-pixel and incident into the corresponding optical lens structure.

In one embodiment, the light-reflective layer includes: a first light-reflective layer configured to totally reflect a light-beam incident on the side-wall face of the corresponding optical lens structure among the light-beams generated from the corresponding sub-pixel and incident into the corresponding optical lens structure; and a second light-reflective layer formed on an outer face of the first light-reflective layer, wherein the second light-reflective layer is configured to reflect a light-beam transmitted through the first light-reflective layer toward an inside of the optical lens structure.

In one embodiment, the first light-reflective layer is formed of a material having a refractive index lower than a refractive index of a material of the optical lens structure, and the second light-reflective layer is formed of a metal material.

In one embodiment, at least one of the first light-reflective layer and the second light-reflective layer comprises light scattering component therein. For example, the light scattering component may include light scattering particles.

In one embodiment, the second light-reflective layer serves as an electrode for sensing a user's touch.

In one embodiment, a top face area of each of the plurality of optical lens structures is smaller than a bottom face area thereof.

In one embodiment, the top face area is about 7 to 45% of the bottom face area.

In one embodiment, the sub-pixels include: a red sub-pixel configured to generates a red light-beam; a blue sub-pixel configured to generates a blue light-beam, wherein the blue sub-pixel has a top face area greater than a top face area of the red sub-pixel; and a green sub-pixel configured to generates a green light-beam, wherein the green sub-pixel has a top face area smaller than the top face areas of the red and blue sub-pixels, wherein the plurality of optical lens structures include: a red optical lens structure disposed on the red sub-pixel; a blue optical lens structure disposed on the blue sub-pixel, wherein the blue optical lens structure has a bottom face area and a top face area that are larger than a bottom face area and a top face area of the red optical lens structure, respectively; and a green optical lens structure disposed on the green sub-pixel, wherein the green optical lens structure has a bottom face area and a top face area that are smaller than bottom face areas and top face areas of the red and blue optical lens structures, respectively.

In one embodiment, each of the plurality of optical lens structures includes light scattering particles dispersed therein.

In one embodiment, the sub-pixels include: a red sub-pixel configured to generates a red light-beam; a blue sub-pixel configured to generates a blue light-beam, wherein the blue sub-pixel has a top face area greater than a top face area of the red sub-pixel; and a green sub-pixel configured to generates a green light-beam, wherein the green sub-pixel has a top face area smaller than the top face areas of the red and blue sub-pixels, wherein the plurality of optical lens structures include: a red optical lens structure disposed on the red sub-pixel; a blue optical lens structure disposed on the blue sub-pixel; and a green optical lens structure disposed on the green sub-pixel, wherein at least one of the red optical lens structure, the blue optical lens structure and the green optical lens structure includes a color filter material wherein the color filter material may transmit light having wavelengths which are the same as those of lights emitted by a corresponding sub pixel and absorb light having wavelengths which are different from those of lights emitted by a corresponding sub pixel. For example, the blue optical lens structure on the blue sub-pixel may include a blue color filter material which absorbs the light except those whose wavelengths are the same as the wavelengths emitted from the blue sub pixel. Hence, the considerable portion of external light is absorbed by the color filter lens.

In one embodiment, the red optical lens structure or the blue optical lens structure includes the color filter material.

In one embodiment, each of the red optical lens structure, the blue optical lens structure and the green optical lens structure includes the color filter material. For example, the red optical lens structure, the blue optical lens structure and the green optical lens structure may include a red color filter material, a blue color filter material, and a green color filter material, respectively.

In one embodiment, the color filter material includes organic dyes, color pigments or quantum dots.

In one embodiment, the light-absorbing member comprises a moisture absorbent.

In one embodiment, the light-emitting unit includes: a substrate, a thin-film transistor layer disposed on the substrate, a first electrode layer disposed on the thin-film transistor layer, a light-emitting layer disposed on the first electrode layer, and a second electrode layer disposed on the light-emitting layer, wherein the low reflective display device comprises a sealing glass disposed on the low reflective unit, wherein the sealing glass together with the substrate is configured to seal the light-emitting layer and the low-reflective unit.

In one embodiment, the light-emitting unit includes: a substrate as a flexible film backplane, a thin-film transistor layer disposed on the substrate, a first electrode layer disposed on the thin-film transistor layer, a light-emitting layer disposed on the first electrode layer, a second electrode layer disposed on the light-emitting layer, and a sealing layer disposed on the second electrode layer to encapsulate the light-emitting layer, wherein the low reflective unit is disposed on the sealing layer.

In one embodiment, at least one of the plurality of optical lens structures include at least two peak portions formed on a corresponding one sub-pixel such that a light-beam generated from the corresponding sub-pixel is guided through the two or more peak portions and then is emitted out of the device.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 1 is a schematic illustration of a cross-section of a low reflective display device according to one embodiment of the present disclosure.

FIG. 2 is a top view schematically showing the arrangement of sub-pixels of the light-emitting unit shown in FIG. 1.

FIG. 3 is a top view schematically illustrating the arrangement of the top end faces of the optical lens structures observed from the top face of the low reflective unit shown in FIG. 1.

FIG. 4 is a cross-sectional view for illustrating the relationship between the sub-pixels of the light-emitting unit and the optical lens structures.

FIG. 5A shows the result of measuring the internal light outputting efficiency based on the diameter of the top face of the optical lens structure for a first display device 'Display 1' including a low reflective unit in which light scattering particles are dispersed in an optical lens structure.

FIG. 5B shows the result of measuring the internal light outputting efficiency based on the diameter of the top face of the optical lens structure for a second display device 'Display 2' including a low reflective unit in which light scattering particles are not dispersed in the optical lens structure.

FIG. 6 shows a result of measuring the external light reflectance based on the diameter of the top face of the optical lens structure for the first to second display devices 'Display1' and 'Display2'.

FIG. 7 is a graph of internal light outputting efficiency and external light reflectance based on the area ratio of the top face area to the bottom face area of the optical lens structure.

FIGS. 8A and 8B are cross-sectional views illustrating another embodiment of the optical lens structure.

FIG. 9 to FIG. 14 are cross-sectional views illustrating a method for manufacturing a low reflective unit of a low reflective display device according to one embodiment of the present disclosure.

FIG. 15 is a cross-sectional view illustrating a low reflective display device according to another embodiment of the present disclosure.

FIG. 16 is a cross-sectional view illustrating a low reflective display device according to still another embodiment of the present disclosure.

FIG. 17 is a cross-sectional view illustrating a low reflective display device according to still yet another embodiment of the present disclosure.

FIG. 18 is a view for illustrating a structure of a display device including a conventional low-reflective polarizer plate.

DETAILED DESCRIPTIONS OF THE INVENTION

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

Hereinafter, the present disclosure will be described with reference to the drawings for illustrating a low reflective display device according to an embodiment of the present disclosure.

FIG. 1 is a schematic illustration of a cross-section of a low reflective display device according to one embodiment of the present disclosure. FIG. 2 is a top view schematically showing the arrangement of sub-pixels of the light-emitting unit shown in FIG. 1. FIG. 3 is a top view schematically illustrating the arrangement of the top end faces of the optical lens structures observed from the top face of the low reflective unit shown in FIG. 1. FIG. 4 is a cross-sectional view for illustrating the relationship between the sub-pixels of the light-emitting unit and the optical lens structures.

Referring to FIG. 1 to FIG. 4, a low reflective display device according to one embodiment of the present disclosure includes a light-emitting unit 10 and a low reflective unit 20.

The low reflective unit 20 is disposed on the top face of the light-emitting unit 10. The top face of the light-emitting unit 10 refers to a plane from which light generated from a plurality of sub-pixels formed in the light-emitting unit 10 is emitted.

The light-emitting unit 10 includes a substrate 11, a thin-film transistor layer 12 disposed on the substrate 11, a first electrode layer 13 disposed on the thin-film transistor layer 12, a light-emitting layer 14 disposed on the first electrode layer 13, and a second electrode layer 15 disposed on the light-emitting layer 14. For example, the light-emitting layer 14 may include a hole injection layer, a hole transfer layer, a emission layer, an electron transfer layer, and an electron injection layer.

The substrate 11 may be embodied as a glass backplane or a flexible polymer backplane.

The thin-film transistor layer 12 may include a plurality of thin film transistors TFT 12 corresponding to a plurality of sub-pixels respectively, wherein the sub-pixels generates red light, green (G), and blue (B) light beams respectively.

The light-emitting layer 14 may include organic light-emitting elements 14b that generate light beams of red (R), green (G), and blue (B) colors, respectively, and spacers 14a that form a boundary between the organic light-emitting elements 14b. The spacer 14a may be embodied as a PDL (Pixel Defining Layer).

Each organic light-emission element 14b forms each sub-pixel. One pixel may include a red (R) sub-pixel 14b-1, a green (G) sub-pixel 14b-2, and a blue (B) sub-pixel 14b-3. As an alternative, in one embodiment, the light-emitting layer 14 may further include an organic light-emitting element 14b for generating white (W) light. In this case, one pixel may include the red (R) sub-pixel 14b-1, the green (G) sub-pixel 14b-2, the blue (B) sub-pixel 14b-3, and a white W sub-pixel (not shown).

The first electrode layer 13 and the second electrode layer 15 may sandwich the light-emitting layer 14 therebetween. The first electrode layer 13 and the second electrode layer 15 may apply an electric field to the organic light-emitting elements 14b so that each of the organic light-emitting elements 14b can generate light. When the first electrode layer 13 is an anode electrode, the second electrode layer 15 may be a cathode electrode. Alternatively, when the first electrode layer 13 is a cathode electrode, the second electrode layer 15 may be an anode electrode.

The low reflective unit 20 includes a plurality of optical lens structures 21, light-reflective layers 22 and 23, and a light-absorbing member 24.

The plurality of optical lens structures 21 correspond in one-to-one manner to the sub-pixels 14b-1, 14b-2, 14b-3 of the light-emitting unit 10. The plurality of optical lens structures 21 may be disposed in one-to-one manner on the corresponding sub-pixels 14b-1, 14b-2, 14b-3 of the light-emitting unit 10. For example, when the light-emitting unit 10 include a red (R) sub-pixel 14b-1 generating a red (R) light-beam, a green (G) sub-pixel 14b-2 that generates a green (G) light-beam, and a blue (B) sub-pixel 14b-3 that produces a blue (B) light-beam, the optical lens structures 21 include a red (R) optical lens structure 21a disposed on the red (R) sub-pixel 14b-1, a green (G) optical lens structure 21b disposed on the green (G) sub-pixel 14b-2, and a blue (B) optical lens structure 21c disposed on the blue (B) sub-pixel 14b-3. As an alternative, when the light-emitting unit 10 further includes a white W sub-pixel (not shown) for generating a white light-beam, the optical lens structures 21 may further include a white W optical lens structure (not shown) disposed on the white W sub-pixel.

Each of the optical lens structures 21 may protrude substantially perpendicularly to the top face of the light-emitting unit 10. Each of the optical lens structures 21 may be made of a polymer material capable of transmitting a light beam. In one embodiment, each of the optical lens structures 21 includes a bottom face in contact with the light-emitting unit 10, a top face opposite the bottom face, and a side-wall face connecting the bottom face and the top face. In this case, each of the top face and bottom face of each of the optical lens structures 21 may be a flat face, or a curved face independently of each other As for each of the optical lens structures 21, in order to improve the output efficiency of outputting the internal light generated in the light-emitting unit 10 while reducing the reflectance of the external light-beam therefrom, the area of the bottom face positioned adjacent to the light-emitting unit 10 may be larger than the area of the top face located far away from the light-emitting unit 10. For example, each of the optical lens structures 21 may have a shape such that the cross sectional area in the horizontal direction parallel to the substrate 11 decreases as the distance from the substrate 11 increases. In other words, each of the optical lens structures 21 may have a tapered shape from the bottom face to the top face.

In one embodiment, the bottom face of each of the optical lens structures 21 may be arranged to cover the entire top face of the corresponding organic light-emitting element 14b such that the entire light-beam generated from the organic light-emitting element 14b is incident into the optical lens structure. To this end, the area of the bottom face of each optical lens structure 21 may be equal to or greater than the area of a top face of the corresponding organic light-emitting element 14b.

In general, the sub-pixels of the OLED have different sizes and shapes based on the color of the light-beam emitted therefrom. For example, referring to FIG. 2, the green (G) sub-pixel G may be smaller than the red (R) sub-pixel R or blue (B) sub-pixel B. For example, the green (G) sub-pixel G has a shape similar to a circle or ellipse, while the red (R) sub-pixel R or blue (B) sub-pixel B may have a shape similar to a rectangle.

In one embodiment, as shown in FIG. 4, when the light-emitting unit 10 includes sub-pixels having different sizes and shapes according to the color of the light-beam emitted therefrom, as described above, the optical lens structures 21 may have different sizes or shapes based on the sizes and shapes of the corresponding sub-pixels.

In one embodiment, the light-emitting unit 10 comprises a blue (B) subpixel 14b-3 having the largest top face area, a green (G) subpixel 14b-2 having the smallest top face area, and a (red) sub-pixel 14b-1 having a middle sized top face area, the optical lens structures 21 may include a blue optical lens structure 21c having the largest bottom face area, a green optical lens structure 21b having the smallest bottom face area, and a red optical lens structure 21a having a bottom face area smaller than the bottom face area of the blue optical lens structure 21c and larger than the bottom face area of the green optical lens structure 21b. In this case, the areas of the top faces of the red, green, and blue optical lens structures 21a, 21b, and 21c may also be configured in the same or similar relationship to the above-defined relationship between the areas of the bottom faces thereof. For example, in terms of the relationship between the top face areas of the red, green, and blue optical lens structures 21a, 21b, and 21c, the top face area of the blue optical lens structure 21c may be the largest, the top face area of the green optical lens structure 21b may be the smallest, and the top face area of the red optical lens structure 21a may have a medium-sized area.

In alternative embodiments, the red, green, and blue optical lens structures 21a, 21b, and 21c may be formed to have the same bottom and top face areas. For example, the blue, green, and red optical lens structures 21a, 21b, and 21c may have the top faces and bottom faces with the same area size equal to the top face area of the blue (B) sub-pixel 14b-3 having the widest top face area. In this case, there is a problem that the external light reflectance increases more or less, but there is an advantage that the manufacturing process thereof is simplified.

Alternatively, the shape of the bottom face of each of the optical lens structures 21 may be similar to the shape of the top face of the corresponding sub-pixel. Alternatively, the shapes of the bottom faces of the optical lens structures 21 may be the same or similar to each other independently of the shape of the top face of the corresponding sub-pixels. Further, the shape of the top face of each of the optical lens structures 21 may be similar to that of the bottom face thereof. Alternatively, the shapes of the top faces of the optical lens structures 21 may be the same or similar to each other independently of the shape of the bottom faces thereof.

In one embodiment, each of the red and blue optical lens structures 21a and 21c, respectively arranged on the red (R) and blue (B) sub-pixels 14b-1 and 14b-3 having a top face similar to the quadrangle may have a quadrangular pyramid or truncated quadrangular pyramid. The green optical lens structure 21b disposed on the green (G) sub-pixel 14b-2 having the circular or elliptical top face may have a shape similar to a cone or truncated cone. In another embodiment, all of the red, green, and blue optical lens structures 21a, 21b, and 21c disposed on the red, green, and blue sub-pixels 14b-1, 14b-2 and 14b-3 may have the shape similar to a cone or truncated cone.

The light-reflective layers 22 and 23 may be formed to cover the side-wall faces of the optical lens structure 21 except for the top face and the bottom face of the optical lens structure 21. The light-reflective layers 22 and 23 may be configured to reflect the light beam incident into the optical lens structure 21 back into the optical lens structure 21.

In one embodiment, the light-reflective layers 22, 23 may include a first light-reflective layer 22 covering the side-wall face of the optical lens structure 21, and a second light-reflective layer 23 covering the first light-reflective layer 22.

The first light-reflective layer 22 may be formed of a material having a lower refractive index than the optical lens structure 21 so as to induce total reflection of incident light beams. In this case, the optical lens structure 21 may be formed of a high-refractive-index polymer material having a refractive index of about 1.6 or more, while the first reflective layer 22 may be formed of an organic or inorganic transparent material having a refractive index of less than about 1.6. Since the first light-reflective layer 22 has a lower refractive index than the optical lens structure 21, as shown in FIG. 1, a light-beam L2 incident on the side-wall face of the optical lens structure 21 out of the light-beams emitted from the organic light-emission element 14b is totally reflected from the interface between the lens structure 21 and the first light-reflective layer 22 and then proceeds back inside the optical lens structure 21. Finally, the light-beam L2 may be emitted to the outside through the top face of the optical lens structure 21 that is not covered by the light-reflective layers 22 and 23.

The second light-reflective layer 23 may be formed of a metallic material having a high reflectivity. The second light-reflective layer 23 may be formed to cover the entire first light-reflective layer 22. For example, the second light-reflective layer 23 may be formed of aluminum, chromium, silver, or the like. The second light-reflective layer 23 reflects a light beam L3 back into the optical lens structure 21, wherein before the light beam L3 reaches the second light-reflective layer 23, the light-beam L3 is incident on the side-wall face of the optical lens structure 21 and passes through the first light-reflective layer 22 without being totally reflected by the first light-reflective layer 22. Because the second light-reflective layer 23 can reflect the light-beam transmitted through the first light-reflective layer 22 back to the inside of the optical lens structure 21, the loss of the internal light generated in the light-emitting unit 10 may be minimized.

Alternatively, the second light-reflective layer 23 may be implemented as an electrode of a touch screen having a touch sensing function. Generally, a touch screen panel built in a display device is composed of first electrodes arranged in the first direction and second electrodes arranged in the second direction orthogonal to the first direction. In accordance with the present disclosure, since the second reflective layer 23 is formed of a metal material and thus has electrical conductivity, the second light-beam reflection layer 23 may be formed to correspond to the first electrodes and the second electrodes such that the second light-beam reflective layer 23 may serve as an electrode of the touch panel that senses a user's touch.

Although, in this embodiment, the light-reflective layers 22 and 23 include both the first light-reflective layer 22 and the second light-reflective layer 23, but the present invention is not limited thereto. According to other embodiments, the light-reflective layer may comprise only one of the first light-reflective layer 22 and the second light-reflective layer 23. For example, the light-reflective layer may comprise only the second light-reflective layer 23.

The light-absorbing member 24 may be formed to fill spaces between the optical lens structures 21 such that the top face of the optical lens structures 21 are exposed. The light-absorbing member 24 may be formed of a material that absorbs an external light-beam so that the external light-beam incident from the outside is not reflected therefrom. Alternatively, in order to protect the organic light-emitting element 14b of the light-emitting unit 10 from moisture, the light-absorbing member 24 may include a moisture absorbent.

Since the optical lens structures 21 have a tapered shape toward the top face thereof, the light-absorbing member 24 has a shape in which the horizontal cross-sectional area thereof increases toward the top face. Therefore, as shown in FIG. 2 and FIG. 3, the sum of the areas of the sub-pixels R, G, and B observed from the top face of the light-emitting unit 10 is about 30 to 50% of the total area of the top face of the light-emitting unit 10. To the contrary, the sum of the areas of the exposed top faces of the optical lens structures 21 may be less than about 20% of the total area of the top face of the low reflective unit 20. Therefore, the reflectance of the external light-beam can be remarkably reduced without using a polarizing film. In one example, the sum of the areas of the exposed top faces of the optical lens structures 21 may about 5 to 20% of the total area of the top face of the low reflective unit 20.

Most of the external light-beams incident on the top face of the low reflective unit 20 from the outside are incident on the light-absorbing member 24 and absorbed by the light-absorbing member 24. A portion of the external light-beam incident on the top face of the low reflective unit 20 is reflected from the optical lens structure 21. As a result, when the area of the top face of the optical lens structure 21 increases, the reflectance of the external light-beam increases. On the other hand, since the internal light is emitted to the outside through the top face of the optical lens structure 21, the area of the top face of the optical lens structure 21 is reduced such that the output efficiency of the internal light is lowered. Thus, the former and latter cases compromise with each other. Means for solving these problems will be described with reference to FIG. 5A, FIG. 5B and FIG. 6.

FIG. 5A shows the result of measuring the internal light outputting efficiency based on the diameter of the top face of the optical lens structure for a first display device Display 1' including a low reflective unit in which light scattering particles are dispersed in an optical lens structure. FIG. 5B shows the result of measuring the internal light outputting efficiency based on the diameter of the top face of the optical lens structure for a second display device Display 2' including a low reflective unit in which light scattering particles are not dispersed in the optical lens structure. FIG. 6 shows a result of measuring the external light reflectance based on the diameter of the top face of the optical lens structure for the first to second display devices 'Display 1' and 'Display2'.

Referring to FIG. 5A, FIG. 5B and FIG. 6, in one embodiment of the present disclosure, in order to reduce the reflectance at which the external light-beam is reflected therefrom and to increase the output efficiency of outputting the internal light to the outside, each of the optical lens structures 21 may include light scattering particles dispersed therein.

The light scattering particles may be made of an inorganic or organic material having a refractive index different from that of the polymer material forming the optical lens structure 21. For example, the light-scattering particles may comprise organic or inorganic particles, such as silica particles, having a particle size of about 100 nm to 1000 nm. In this way, when the light scattering particles are dispersed in the optical lens structure 21, the output efficiency of the internal light can be improved while reducing the reflectance of the external light-beam.

Referring to FIG. 5A, FIG. 5B and FIG. 6, the followings are discovered: in the case of the first display device 'Display 1' including an optical lens structure including the light scattering particles, when the ratio of top face area to bottom face area increases, the increase rate of external light reflectance is remarkably reduced, and the increase rate of the internal light outputting efficiency is remarkably increased, compared to in the case of the second display device 'Display 2' including an optical lens structure without light-scattering particles. In particular, in case of the 'Display2', which includes an optical lens structure without the light-scattering particles, when the top face area of the optical lens structure 21 is greater than 50% of the bottom face area thereof, and the ratio of the top face area to the bottom face area increases, the outputting efficiency of the internal light does not increase but decreases. To the contrary, in case of 'Display1' which includes optical lens structure including light-scattering particles, when the top face area of the optical lens structure 21 is greater than 50% of the bottom face area thereof, and the ratio of the top face area to the bottom face area increases, the outputting efficiency of the internal light is continuously increased.

FIG. 7 is a graph of internal light outputting efficiency and external light reflectance based on the area ratio of the top face area to the bottom face area of the optical lens structure.

Referring to FIG. 7, it may be seen that as the ratio of the top face area to the bottom face area of the optical lens structure increases, the outputting efficiency of the internal light and the reflectance of the internal light are both increased. Specifically, as the ratio of the top face area to the bottom face area of the optical lens structure increases, the reflectance of the external light-beam increases linearly. The outputting efficiency of the internal light reaches a maximum value when the ratio of the top face area to the bottom face area of the optical lens structure is about 45%, and is maintained constant thereafter.

In one embodiment of the present disclosure, the ratio of the top face area to the bottom face area of the optical lens structure 21 is preferably less than about 45% such that the reflectance of the external light-beam is less than about 7%. The ratio of the top face area to the bottom face area of the optical lens structure 21 is preferably about 7% or more so that the efficiency of the internal light is about 40% or more.

To lower the reflectance of the external light-beam and increase the outputting efficiency of the internal light, in each of the optical lens structures 21, the ratio of the top face area to the bottom face area may be about 10% or more and 37% or less.

FIG. 8A and FIG. 8B are cross-sectional views illustrating another embodiment of the optical lens structure.

Referring to FIG. 8A and FIG. 8B, in one embodiment of the present disclosure, at least some of the optical lens structures 21 may include a color filter material to significantly reduce the reflectance of the external light-beam without degrading the outputting efficiency of the internal light.

In one embodiment, when the optical lens structures 21 include the red (R) optical lens structure 21a disposed on the red (R) sub-pixel 14b-1, the green (G) optical lens structure 21b disposed on the green (G) sub-pixel 14b-2, and the blue (B) optical lens structure 21c disposed on the blue (B) sub-pixel 14b-3, at least one of the red (R), green (G) and blue (B) optical lens structures 21a, 21b and 21c may include a color filter material which does not absorb a first light beam generated from the corresponding sub-pixel but absorbs a second light-beam having a shorter or longer wavelength than the first light-beam from the external light beams. In this way, a light-beam of the same or similar wavelength as the first light-beam may be emitted from the corresponding lens structure. The color filter material may include organic dyes or pigments, or inorganic color filter materials such as quantum dots, and the like.

In one embodiment, as shown in FIG. 8A, only a blue optical lens structure 21c having a relatively large top face area among the red (R), green (G) and blue (B) optical lens structures 21a, 21b and 21c may contain a blue color filter material. In this case, it is confirmed that the external light reflectance is reduced by about 30% compared to the case where any one of the red (R), green (G) and blue (B) optical lens structures 21a, 21b and 21c do not contain a color filter material.

In another embodiment, as shown in FIG. 8B, red, green and blue color filter materials may be included in the red (R), green (G) and blue (B) optical lens structures 21a, 21b and 21c, respectively. In this case, it was confirmed that the external light reflectance was reduced by about 70% as compared with the case where all of the red (R), green (G), and blue (B) optical lens structures 21a, 21b and 21c do not contain color filter material.

In the low reflective display device according to the present disclosure, the outputting efficiency of the internal light can be improved while reducing the reflectance of the external light-beam, compared to a conventional display device including a low-reflective polarizer plate.

In the present disclosure's low reflective display device, as shown in FIG. 1, the light-beams L1, L2 and L3 emitted from the organic light-emitting element 14b include the followings: the light-beam L1 emitted from the organic light-emitting element 14b and emitted directly through the top face of the optical lens structure 21; the light-beam L2, which is totally reflected by the first light-reflective layer 22 at least once and emitted through the top face of the optical lens structure 21; and the light-beam L3 that is reflected by the second light-reflective layer 23 more than once and is emitted through the top face of the optical lens structure 21. Most of the light beams L1, L2, and L3 emitted from the organic light-emitting element 14b are emitted only through the optical lens structure 21 or through the optical lens structure 21 and the first light-reflective layer 22. That is, the light beams L1, L2, and L3 emitted from the organic light-emitting element 14b do not pass through another optical members. Thus, the low reflective display device according to the present disclosure has less light-beam loss than a low reflective display device using a conventional low-reflective polarizer plate.

That is, in the case of a display device including a conventional low-reflective polarizer plate, a light-beam loss of 50% or more inevitably occurs in view of its structural aspect. In contrast, in a low reflective display device according to the present embodiment, about 70 to 85% of the light emitted from the organic light-emitting element 14b can be emitted through the top face of the optical lens structure 21, thereby to achieve excellent internal light outputting efficiency.

Hereinafter, a method of manufacturing a low reflective display device according to one embodiment of the present disclosure will be described.

FIG. 9 to FIG. 14 is a cross-sectional view illustrating a method of manufacturing a low reflective unit of a low reflective display device according to one embodiment of the present disclosure.

Referring to FIG. 9 to FIG. 14, a method of manufacturing a low reflective display device according to one embodiment of the present disclosure includes the following operations: an operation S11 for forming a light-emitting unit including a plurality of sub-pixels, an operation S12 for forming a transparent polymer layer on the light-emitting unit, an operation S13 for forming a plurality of optical lens structures, an operation S14 forming a light-reflective layer, an operation S15 forming a light-absorbing member, and an operation S16 to etch a surface.

The operation S11 for forming a light-emitting unit 10 including a plurality of sub-pixels includes the following operations: an operation for forming a thin-film transistor layer 12 on a substrate 11; an operation of forming a first electrode layer 13 on the thin-film transistor layer 12; an operation of forming a light-emitting layer 14 on the first electrode layer 13; and an operation for forming a second electrode layer 15 on the light-emitting layer 14. The operation of forming the light-emitting unit 10 is the same as or similar to the well-known process of manufacturing a display panel, and, thus, detailed descriptions thereof will be omitted.

In the operation S12 for forming the transparent polymer layer on the light-emitting unit, as shown in FIG. 9, a transparent polymer layer 21a having a predetermined thickness may be formed on the light-emitting unit 10 manufactured in operation S11. The method of forming the transparent polymer layer 21a is not limited in a particular manner.

In the operation S13 for forming the plurality of optical lens structures, as is shown in FIG. 10, the transparent polymer layer 21a is processed to form a plurality of optical lens structures 21.

As an example of a method of processing the transparent polymer layer 21a, the photolithography process may be used. In the case of forming the plurality of optical lens structures 21 using the photolithography process, a photosensitive material having a high visible light transmittance and hardly allowing the visible light absorption is coated on the unit 10 to a thickness of 50 to 300 μm. The photosensitive material is light-exposed using a mask so that the photosensitive material remains corresponding to the sub-pixels of the light-emitting unit 10, and then the non-residual region is developed to form the plurality of optical lens structures 21.

As another example of a method of processing the transparent polymer layer 21a, an imprinting process may be used. In the case of forming the plurality of optical lens structures 21 by using the imprinting process, a mold having a hollow relief defined therein shape-corresponding to the plurality of optical lens structures 21 to be formed is pressed into the transparent polymer layer 21a, thereby to form the plurality of optical lens structures 21.

Alternatively, the S12 operation may be omitted. In this case, a transparent polymer is applied to a mold having a hollow relief defined therein shape-corresponding to the plurality of optical lens structures 21 to be formed. Then, the process proceeds with aligning the light-emitting unit 10 and the mold each other. Then, the transparent polymer filled in the recessed hollow portion defined in the mold is directly imprinted on the light-emitting unit 10 to form the plurality of optical lens structures 21.

In the operation S14 forming the light-reflective layer, as shown in FIG. 11 and shown in FIG. 12, a first light-reflective layer 22 and a second light-reflective layer 23 may be sequentially formed on the sidewalls of the plurality of optical lens structures 21. In this case, the first light-reflective layer 22 and the second light-reflective layer 23 may be disposed on the region between the plurality of optical lens structures 21, that is, the top face of the light-emitting unit 10 as exposed by the optical lens structures 21.

The first light-reflective layer 22 may be formed of a polymer or an inorganic film having a lower refractive index than the optical lens structure 21. As shown in FIG. 11, the first light-reflective layer 22 may be formed to completely cover the plurality of optical lens structures 21. The scheme of forming the first light-reflective layer 22 is not limited to any particular manner. In one example, the first light-reflective layer 22 may be formed by coating or vapor-depositing the low refractive index polymer or inorganic material.

The second light-reflective layer 23 may be formed of a metal material having high reflectance such as aluminum, chromium, and silver. As shown in FIG. 12, the second light-reflective layer 23 may be formed to completely cover the first light-reflective layer 22. The scheme of forming the second light-reflective layer 23 is not limited to any particular manner. For example, the second light-reflective layer 23 may be formed by depositing a metal.

Alternatively, only one of the first light-reflective layer 22 and the second light-reflective layer 23 may be formed, depending on the embodiments.

In the operation S15 for forming the light-absorbing member, as shown in FIG. 13, the light-absorbing member 24 is formed on the second light-reflective layer 23. The light-absorbing member 24 may be formed by a method such as bar-coating or spin-coating. The light-absorbing member 24 may have a thickness greater than the height of the optical lens structure 21.

In the operation S16 for etching the surface, as shown in FIG. 14, a portion of each of the light-absorbing member 24, the second light-reflective layer 23, the first light-reflective layer 22, and each of the optical lens structures 21 may be etched to expose a top end of each of the plurality of optical lens structures 21. As the etching method, dry etching may be used.

In the following, low reflective display devices according to another embodiments of the present disclosure will be described.

FIG. 15 is a cross-sectional view illustrating a low reflective display device according to another embodiment of the present disclosure.

Referring to FIG. 15, a low reflective display device 100 according to the present invention may include a light-emitting unit 10, a low reflective unit 20, a sealing material 31, and a sealing glass 41.

The light-emitting unit 10 may include an OLED display panel including a glass substrate. In this case, the substrate 11 of the light-emitting unit 10 may be embodied as a glass backplane. The light-emitting unit 10 may include a thin-film transistor layer 12, a first electrode layer 13, a light-emitting layer 14, and a second electrode layer 15 sequentially stacked on the glass backplane 11 in this order.

The low reflective unit 20 is substantially the same as the low reflective display device according to the embodiment described with reference to FIG. 1 to FIG. 7. Therefore, redundant detailed descriptions thereof will be omitted.

The sealing material 31 is formed on the outermost spacer 14a. The sealing glass 41 is disposed on the low reflective unit 20. An edge portion of the sealing glass 41 is supported by the sealing material 31. The sealing material 31 and the sealing glass 41 may be configured to protect the light-emitting layer 14 and the low reflective unit 20 from external foreign matter, moisture, and the like.

FIG. 16 is a cross-sectional view illustrating a low reflective display device according to still another embodiment of the present disclosure.

Referring to FIG. 16, a low reflective display device 200 according to the present invention may include a light-emitting unit 10, and a low reflective unit 20.

The light-emitting unit 10 may include a flexible OLED display panel employing a flexible film-like backplane as a substrate. In this case, the substrate 11 of the light-emitting unit 10 may be embodied as a polymer film-like backplane. The light-emitting unit 10 may include a thin-film transistor layer 12, a first electrode layer 13, a light-emitting layer 14, and a second electrode layer 15 sequentially stacked on the polymer film-like backplane in this order.

The light-emitting unit 10 may further include a sealing layer 16 disposed on the second electrode layer 15. The sealing layer 16 protects the light-emitting layer 14 and the like from external foreign substances.

In this case, the low reflective unit 20 may be disposed on the sealing layer 16. The low reflective unit 20 is substantially the same as the low reflective display device according to the embodiment described with reference to FIG. 1 to FIG. 7. Therefore, redundant detailed descriptions thereof will be omitted.

Alternatively, components for protecting the low reflective unit 20 from external foreign substances or the like may be added according to an embodiment.

FIG. 17 is a cross-sectional view illustrating a low reflective display device according to still another embodiment of the present disclosure. For convenience of illustration, the same reference numerals are given to components similar to those in the above-described embodiments, and description thereof will be omitted. For convenience of illustration, the optical lens structure 21 according to the above-described embodiments is shown in dotted lines for comparison.

Referring to FIG. 17, a low reflective display device according to the present embodiment has substantially the same configuration of the low reflective display device according to the embodiment as above-described with reference to FIG. 1 to FIG. 7 except that the shape of the optical lens structure 121 is different from the optical lens structure 21 in the above-described embodiment. Therefore, the optical lens structure 121 will be mainly described, and detailed descriptions of the same configurations will be omitted.

It is preferable to increase an inclination angle of the side-wall face of each of the optical lens structures 21 and 121 in order to increase the output efficiency of outputting the light-beam emitted from the organic light-emission element 14b to the outside. However, when the inclination angle of the side-wall face is increased, the top face area of the optical lens structures 21 and 121 increases or the height of the structure increases in proportion to the increased inclination angle. This problem similarly occurs when the area of the top face of the organic light-emission element 14b is large.

To solve this problem, the optical lens structure 121 according to the present embodiment as shown in FIG. 17 may be configured such that the light emitted from the organic light-emitting element 14b may be emitted the outside through two peak portions. In this way, the top face area may be reduced or the height of the structure may be reduced while increasing the side-wall face inclination angle of the optical lens structure 121. As a result, the reflectance of the external light-beam may be reduced while improving the efficiency of output of the internal light.

Those of ordinary skill in the art to which the present disclosure belongs may understand that the present disclosure may be made in other specific forms without departing from the spirit or essential characteristics thereof. It is therefore to be understood that the embodiments described above are in all respects illustrative and not restrictive. The scope of the present disclosure is defined by the appended claims rather than the foregoing description, and all changes or modifications that come within the meaning and range of the claims and the equivalents thereof are intended to be included within the scope of the present disclosure.

What is claimed is:
1. A low reflective display device comprising:
a light-emitting unit comprising a plurality of sub-pixels separated from each other by spacers; and
a low reflective unit disposed on the light-emitting unit, wherein the low reflective unit comprises:

a plurality of optical lens structures arranged in a position-corresponding manner to the plurality of sub-pixels thereon respectively, wherein each of the plurality of optical lens structures has a bottom face onto which light-beams generated from a corresponding sub-pixel of the plurality of sub-pixels is incident, a top face out of which the incident light beam is emitted, and a side-wall face connecting the bottom face and the top face of the optical lens structure;

a light-reflective layer covering the side-wall face of each optical lens structure, the light-reflective layer reflecting the light-beam incident on the side-wall face into an inside of the optical lens structure; and a light-absorbing member arranged to fill spaces between the optical lens structures, wherein the light-absorbing member is configured to expose the bottom and top faces of each of the plurality of optical lens structures, wherein the bottom face of each of the plurality of optical lens structures completely covers the top face of the corresponding sub-pixel of the plurality of sub-pixels and receives all of the light-beams generated from the corresponding sub-pixel, and wherein the bottom face of each of the plurality of optical lens structures has a first area and the top face of the corresponding sub-pixel has a second area such that the first area is greater than or equal to the second area wherein the top face of each of the plurality of optical lens structures has a third area, wherein the third area is smaller than the first area, wherein the sub-pixels comprises:
 a red sub-pixel configured to generate a red light-beam;
 a blue sub-pixel configured to generate a blue light-beam, wherein the blue sub-pixel has a blue sub-pixel top face area greater than a red sub-pixel top face area of the red sub-pixel; and
 a green sub-pixel configured to generate a green light-beam, wherein the green sub-pixel has a green sub-pixel top face area smaller than the top face areas of the red and blue sub-pixels, and wherein the plurality of optical lens structures comprises:
 a red optical lens structure disposed on the red sub-pixel;
 a blue optical lens structure disposed on the blue sub-pixel, wherein the blue optical lens structure has a blue optical lens structure bottom face area and a blue optical lens structure top face area that are larger than a red optical lens structure bottom face area and a red optical lens structure top face area of the red optical lens structure, respectively; and
 a green optical lens structure disposed on the green sub-pixel, wherein the green optical lens structure has a green optical lens structure bottom face area and a green optical lens structure top face area that are smaller than bottom face areas and top face areas of the red and blue optical lens structures, respectively.

2. The low reflective display device of claim 1, wherein the light-reflective layer has a refractive index that is lower than that of the optical lens structure such that the light-reflective layer totally reflects the light-beam incident on the side-wall face into the inside of the optical lens structure.

3. The low reflective display device of claim 1, wherein the light-reflective layer comprises:
 a first light-reflective layer configured to totally reflect the light-beam incident on the side-wall face into the inside of the optical lens structure; and
 a second light-reflective layer disposed on an outer face of the first light-reflective layer, wherein the second light-reflective layer is configured to reflect a light-beam transmitted through the first light-reflective layer toward the inside of the optical lens structure.

4. The low reflective display device of claim 3, wherein the first light-reflective layer is formed of a material having a refractive index that is lower than that of a material of the optical lens structure, and the second light-reflective layer is formed of a metal material.

5. The low reflective display device of claim 4, wherein the second light-reflective layer serves as an electrode for sensing a user's touch.

6. The low reflective display device of claim 1, wherein the third area is about 7 to 45% of the second area.

7. The low reflective display device of claim 1, wherein each of the plurality of optical lens structures comprises light scattering particles dispersed therein.

8. The low reflective display device of claim 1,
 wherein at least one of the red optical lens structure, the blue optical lens structure and the green optical lens structure comprises a color filter material, wherein the color filter material is configured to absorb a first light-beam having a shorter or longer wavelength than a second light-beam generated from the corresponding sub-pixel without absorbing the second light-beam.

9. The low reflective display device of claim 8, wherein the red optical lens structure or the blue optical lens structure comprises the color filter material.

10. The low reflective display device of claim 8, wherein each of the red optical lens structure, the blue optical lens structure and the green optical lens structure comprises the color filter material.

11. The low reflective display device of claim 8, wherein the color filter material comprises organic dyes, organic pigments or quantum dots.

12. The low reflective display device of claim 1, wherein the light-absorbing member comprises a moisture absorbent.

13. The low reflective display device of claim 1, wherein the light-emitting unit comprises:
 a substrate,
 a thin-film transistor layer disposed on the substrate,
 a first electrode layer disposed on the thin-film transistor layer,
 a light-emitting layer disposed on the first electrode layer, and
 a second electrode layer disposed on the light-emitting layer,
 wherein the low reflective display device further comprises a sealing glass disposed on the low reflective unit, wherein the sealing glass together with the substrate is configured to seal the light-emitting layer and the low-reflective unit.

14. The low reflective display device of claim 1, wherein the light-emitting unit comprises:
 a substrate as a flexible film backplane,
 a thin-film transistor layer disposed on the substrate,
 a first electrode layer disposed on the thin-film transistor layer,
 a light-emitting layer disposed on the first electrode layer,
 a second electrode layer disposed on the light-emitting layer, and
 a sealing layer disposed on the second electrode layer to encapsulate the light-emitting layer,
 wherein the low reflective unit is disposed on the sealing layer.

15. The low reflective display device of claim 1, wherein at least one of the plurality of optical lens structures comprises two or more peak portions formed on the corresponding sub-pixel such that a light-beam generated from the corresponding sub-pixel is guided through the two or more peak portions and then is emitted out of the at least one of the plurality of optical lens structures.

* * * * *